(12) United States Patent
Andrieu

(10) Patent No.: US 11,653,506 B2
(45) Date of Patent: May 16, 2023

(54) RESISTIVE 3D MEMORY

(71) Applicant: COMMISSARIAT A L'ENERGIE ATOMIQUE ET AUX ENERGIES ALTERNATIVES, Paris (FR)

(72) Inventor: François Andrieu, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 66 days.

(21) Appl. No.: 17/040,138

(22) PCT Filed: Mar. 26, 2019

(86) PCT No.: PCT/FR2019/050677
§ 371 (c)(1),
(2) Date: Sep. 22, 2020

(87) PCT Pub. No.: WO2019/186045
PCT Pub. Date: Oct. 3, 2019

(65) Prior Publication Data
US 2021/0028231 A1      Jan. 28, 2021

(30) Foreign Application Priority Data

Mar. 27, 2018   (FR) .................................... 18 52657

(51) Int. Cl.
*H10B 63/00*   (2023.01)
*H01L 21/02*   (2006.01)
(Continued)

(52) U.S. Cl.
CPC ..... *H10B 63/845* (2023.02); *H01L 21/02532* (2013.01); *H01L 21/02603* (2013.01);
(Continued)

(58) Field of Classification Search
CPC . H01L 45/14; H01L 27/2436; H01L 45/1253; H01L 27/249
See application file for complete search history.

(56) References Cited

U.S. PATENT DOCUMENTS

| | | |
|---|---|---|
| 9,053,976 B2 | 6/2015 | Ernst et al. |
| 2009/0218558 A1 | 9/2009 | Park et al. |

(Continued)

OTHER PUBLICATIONS

International Search Report and Written Opinion (with English Translation of Categories of Cited Documents) dated Jul. 15, 2019 in PCT/FR2019/050677 filed on Mar. 26, 2019, 16 total pages.

(Continued)

*Primary Examiner* — Brian Turner
(74) *Attorney, Agent, or Firm* — Oblon, McClelland, Maier & Neustadt, L.L.P.

(57) ABSTRACT

A memory device is provided with a support and several superimposed levels of resistive memory cells formed on the support, each level having one or more rows of one or more resistive memory cell(s), each resistive memory cell having a variable resistance memory element formed by an area of variable resistivity material arranged between a first electrode and a second electrode. The memory element is connected to a source region or drain region of a control transistor, the control transistor being formed in a given semiconductor layer of a stack of semiconductor layers formed on the support and wherein respective channel regions of respective control transistors of resist memory cells are arranged.

24 Claims, 17 Drawing Sheets

(51) Int. Cl.

| | |
|---|---|
| *H01L 21/3065* | (2006.01) |
| *H01L 21/308* | (2006.01) |
| *H01L 29/06* | (2006.01) |
| *H01L 29/423* | (2006.01) |
| *H01L 29/66* | (2006.01) |
| *H01L 29/786* | (2006.01) |
| *H10N 70/00* | (2023.01) |

(52) U.S. Cl.
CPC ........ *H01L 21/308* (2013.01); *H01L 21/3065* (2013.01); *H01L 29/0673* (2013.01); *H01L 29/42392* (2013.01); *H01L 29/66742* (2013.01); *H01L 29/78618* (2013.01); *H01L 29/78696* (2013.01); *H10B 63/30* (2023.02); *H10N 70/066* (2023.02)

(56) References Cited

U.S. PATENT DOCUMENTS

| | | | |
|---|---|---|---|
| 2011/0300683 A1 | 12/2011 | Park et al. | |
| 2013/0070506 A1 | 3/2013 | Kajigaya et al. | |
| 2013/0203227 A1* | 8/2013 | Huo | H01L 27/0688 438/238 |
| 2013/0270508 A1* | 10/2013 | Li | H01L 45/1206 977/762 |
| 2013/0288391 A1 | 10/2013 | Lee et al. | |
| 2014/0054538 A1 | 2/2014 | Park | |
| 2014/0321193 A1* | 10/2014 | Park | H01L 27/2481 257/295 |
| 2015/0131360 A1* | 5/2015 | Petti | G11C 13/0002 438/238 |
| 2015/0249053 A1 | 9/2015 | Or-Bach et al. | |
| 2016/0148981 A1* | 5/2016 | Matsueda | H01L 27/3218 257/40 |
| 2016/0300614 A1* | 10/2016 | Nebashi | G11C 11/1675 |
| 2016/0300885 A1* | 10/2016 | Konevecki | H01L 27/249 |
| 2017/0084329 A1* | 3/2017 | Tokuhira | G11C 13/004 |
| 2017/0092541 A1 | 3/2017 | Or-Bach et al. | |

OTHER PUBLICATIONS

Preliminary French Search Report (with English Translation of Categories of Cited Documents) dated Dec. 7, 2018 in French Application No. 1852657 filed on Mar. 27, 2018, 1 page.
Li et al., "Four-Layer 3D Vertical RRAM Integrated with FinFET as a Versatile Computing Unit for Brain-Inspired Cognitive Information Processing", Symposium on VLSI Technology Digest of Technical Papers, 2016, 2 total pages.
Li et al., "1 Mb 0.41 µm$^2$ 2T-2R Cell Nonvolatile TCAM With Two-Bit Encoding and Clocked Self-Referenced Sensing", IEEE Journal of Solid-State Circuits, 2014, vol. 49, No. 4, pp. 896-907.
Baek et al., "Realization of Vertical Resistive Memory (VRRAM) using cost effective 3D Process", IEDM11-737, 2011, pp. 31.8.1-31.8.4 (4 total pages).
Chen et al., "HfOx Based Vertical Resistive Random Access Memory for Cost-Effective 3D Cross-Point Architecture without Cell Selector", IEDM12-497, 2012, pp. 20.7.1-20.7.4 (4 total pages).
Kurotsuchi et al., "2.8-GB/s-write and 670-MB/s-erase operations of a 3D vertical chain-cell-type phase-change-memory array", Symposium on VLSI Technology Digest of Technical Papers, 2015, pp. T92-T93 (2 total pages).
Li et al, "Hyperdimensional Computing with 3D VRRAM In-Memory Kernels: Device-Architecture Co-Design for Energy-Efficient, Error-Resilient Language Recognition", IEDM16-412, 2016, pp. 16.1.1-16.1.4 (4 total pages).
"International Roadmap for Devices and Systems", 2016 Edition, IEEE Advancing Technology for Humanity, pp. 1-22 (23 total pages).
Burr et al., "Access devices for 3D crosspoint memory", Journal of Vacuum Science & Technology B, Nanotechnology and Microelectronics: Materials, Processing, Measurement, and Phenomena, 2014, vol. 32, No. 4, pp. 040802-1-040802-23 (24 total pages).
U.S. Appl. No. 16/221,939, filed Dec. 17, 2018, US 2019/0198397 A1, Andrieu et al.
U.S. Appl. No. 16/525,043, filed Jul. 29, 2019, US 2020/0035561 A1, Batude et al.
U.S. Appl. No. 16/716,659, filed Feb. 17, 2019, US 2020/0203229 A1, Batude et al.
U.S. Appl. No. 16/709,993, filed Dec. 11, 2019, US 2020/0194273 A1, Reboh et al.

\* cited by examiner

RESISTIVE 3D MEMORY

TECHNICAL FIELD AND PRIOR ART

The present invention relates to the field of microelectronics and memories and in particular to that of resistive random-access memories (RRAM or ReRAM).

Resistive memories have as a common operating principle that their changes of states are due to changes of resistivity of a material disposed between two electrodes.

There are several types of resistive memories among which are included PCRAMs (Phase-change Random Access Memory), CBRAMs (Conductive-Bridging RAM), and OxRAMs.

In an OxRAM, the material arranged between the electrodes comprises a dielectric oxide, which is normally insulating and can be made conducting by creating filaments or a conduction path in this material after applying a sufficient voltage or current.

It is continuously attempted to increase the density of memory devices.

For this, devices in which memory cells are distributed on several superimposed levels, have appeared.

In the field of resistive memories, document: "Four Layer 3D Vertical RRAM Integrated with FinFET as Versatile Computing unit for Brain-Inspired Cognitive information Processing", by Li et al., Symposium on VLSI Technology Digest of Technical Papers 2016, sets forth a device with resistive memory cells made from a stack of layers and which are distributed on several levels of superimposed cells. Each cell of this device is formed of a memory element having a TiN electrode, a HfOx type dielectric and another electrode formed of a TiN and stack. Reading or writing information contained in the memory element is made through a so-called "select" transistor. In this device, a same select transistor is associated with an assembly of four superimposed memory elements and is thus used to address these 4 elements. With such an arrangement, superimposed memory elements are associated with the same select transistor and do not have an independent addressing.

Moreover, the select transistor is formed in a surface semi-conducting layer of a substrate and takes up space in this semi-conducting layer that may be desired to be dedicated to another function or other functions.

The problem arises of making a new device with resistive memory cells and which is improved with respect to above-mentioned drawbacks.

DISCLOSURE OF THE INVENTION

To meet especially the objects set forth above, the invention first provides, according to an embodiment, a memory device provided with a support and with several superimposed levels of resistive memory cells formed on this support, each level comprising one or more rows of one or more resistive memory cells, each resistive memory cell comprising a variable resistance memory element formed of a variable resistivity material zone disposed between a first electrode and a second electrode, said memory element being connected to a source or drain region of a control transistor, said control transistor being formed in a given semi-conducting layer of a superimposition of semi-conducting layers formed on said support and in which respective channel regions of respective control transistors of resistive memory cells are arranged.

Variable resistance memory elements can in particular be of the PCRAM or OxRAM type.

With such an arrangement, using control transistors formed in the stack, an independent addressing can be made between different memory elements superimposed or arranged in columns.

When the stack is disposed above a so-called "front-end" semi-conducting layer of the support, this arrangement enables addressing of memory elements to be made while dedicating this semi-conducting layer to other functions or other circuits.

One or more memory peripheral circuits can especially be provided, for example a block for addressing cells in particular a row decoder and/or at least one sense amplifier and/or at least one analog/digital converter.

Advantageously, the memory elements can be of the OxRAM type, the variable resistivity material zone being for example a dielectric oxide.

According to a possible implementation, the device can be provided with a first vertical column of cells of different levels including a first cell of a first level and a second cell belonging to a second level from said superimposed levels of cells, the first cell and the second cell being respectively provided with a first control transistor and second control transistor, the first control transistor and second control transistor having a common gate electrode or having respective gate electrodes connected to each other and to a same conducting zone.

The common gate electrode or said respective gate electrodes can be interconnected to a same conducting zone which is called "first word plane". Advantageously, the device can include a second vertical column of cells having a third cell belonging to the first level and a fourth cell belonging to the second level and respectively provided with a third control transistor and fourth control transistor, the third control transistor and fourth control transistor having a gate connected to said first word plane.

According to a possible implementation of the device, the first cell and third cell can be connected to a same first horizontal bias line from a plurality of horizontal bias lines in which the second cell and fourth cell are connected to a same second horizontal bias line of said plurality of horizontal bias lines. The first bias line and second bias line are distinct and can thus be led to receive different electric signals.

Advantageously, the first cell and third cell can be disposed on a same first row of cells of said first level whereas the second cell and fourth cell are disposed on a same first row of cells of said second level, the device comprising another word plane, distinct from said first word plane, and respectively connected to cells of a second row of cells of said first level and to a second row of cells of said second level. The device can thus be provided with distinct word planes capable of receiving distinct control electric signals.

The first cell and second cell can be connected to a same first vertical bias line from a plurality of vertical bias lines, whereas the third cell and fourth cell are connected to a same second vertical bias line of said plurality of vertical bias lines.

Advantageously, a fifth cell belonging to the first level and to a second row of cell(s) different from the first row, and a sixth cell belonging to the second level can be connected to said first vertical bias line.

According to an embodiment, the superimposition of semi-conducting layers belongs to a stack of layers comprising one or more insulating layers, each disposed between two semi-conducting layers of said superimposition of semi-conducting layers. Thus, electrically insulating stages from each other can be performed.

A particular embodiment provides said source or drain region of said control transistor connected to another variable resistance memory element formed of a variable resistivity material zone disposed between two electrodes, said memory element and said other memory element being respectively arranged on an upper face and on a lower face of said given semi-conducting layer. For such a configuration, although an independent addressing of superimposed memory elements is implemented within the device, a same control transistor is associated with two memory elements.

Advantageously, the control transistor can have a dual gate or a gate-all-around. In both cases, this gate can extend against an upper face and against a lower face of said given semi-conducting layer.

According to another aspect, the present invention relates to a method for making a 3D memory device with resistive memory cells such as defined above.

Such a method comprises at least one step of forming a stack of layers comprising said superimposition of semi-conducting layers on a support.

Advantageously, the stack is formed on a semiconductor material surface layer of the support in which channel regions of transistors are already arranged when the stack is made. In this case, the surface layer can be dedicated to other functions than the memory elements.

According to an aspect of the method, the semi-conducting layers of the stack can each be formed through amorphous deposition, in particular of CVD type. In this case, the stack can then be exposed to at least one laser annealing so as to make the semi-conducting layers crystalline. During this deposition, a concomitant doping can advantageously be performed.

According to a particular example of embodiment of the method, prior to forming said stack, forming one or more horizontal routing lines on the support can be provided. Such a routing line can enable a connection to be established between several bias conducting lines which extend vertically.

Advantageously, the stack formed on the support comprises alternating sacrificial layers and semi-conducting layers forming said superimposition of semi-conducting layers, each semi-conducting layer of said superimposition being typically arranged on and in contact with a first sacrificial layer and under and in contact with a second sacrificial layer.

Subsequently etching these sacrificial layers is then for revealing portions of a lower face and of an upper face of semi-conducting layers in order to establish contacts or connections or to form electrodes.

According to a possible implementation of the method, the latter comprises, after forming the stack, steps consisting in:
    forming at least one hole or at least one trench through the stack so as to reveal a zone of this stack,
    in this zone, performing selective etching of parts of sacrificial layers, so as to free a space against a portion of an upper face of said given semi-conducting layer(s) and to free another space against a portion of a lower face of the given semi-conducting layer(s), the lower face being opposite to the upper face, and then
    forming conducting regions on said portions.

After selective etching and prior to forming conducting regions, forming insulating spacers partially filling said spaces can be provided.

According to a first embodiment, conducting regions form the first respective electrodes of memory elements of a memory element assembly, the method further comprising steps of:
    into said hole or said trench, making a variable resistivity material layer, in particular based on dielectric oxide, and then
    filling the hole or trench using at least another conducting layer forming the respective second electrodes of said memory elements of said assembly and a vertical bias line connected to said second electrodes of said memory elements of said assembly.

According to a second embodiment, conducting regions are formed of at least one first conducting layer capable of forming a first electrode of memory element, and wherein it is then deposited into said spaces:
    a variable resistivity material layer of memory element, in particular based on dielectric oxide on the first conducting layer, and then another conducting layer, forming a second electrode of memory element, the method subsequently further comprising steps of:
    removing from said hole or said trench the first conducting layer, the variable resistivity material layer and the other conducting layer and then, filling said hole or said trench with an insulating material.

According to a possible implementation, the method can comprise, after forming the stack, steps of:
    forming at least one masking covering the stack and including one or more apertures,
    performing a selective removal of sacrificial layers so as to continue said aperture(s) of the masking in the stack, and
    forming a gate dielectric and a gate conducting electrode in the aperture(s).

BRIEF DESCRIPTION OF DRAWINGS

The present invention will be better understood upon reading the description of examples of embodiment given, by way of purely indicating and in no way limiting purposes, with reference to the appended drawings in which.

Identical, similar or equivalent parts of the different figures bear the same reference numerals so as to facilitate switching from one figure to the other.

Different parts represented in figures are not necessarily drawn according to a uniform scale, in order to make the figures more understandable.

Furthermore, in the description thereafter, terms which depend on the orientation of the structure such as "on", "above", "vertical", "horizontal", "side", "upper", "lower"

are applied while considering that the structure is oriented in the way illustrated in the figures.

DETAILED DISCLOSURE OF PARTICULAR EMBODIMENTS

An example of a 3-dimensional or "3D" memory microelectronic device such as implemented according to an embodiment of the present invention, will now be described in connection with FIGS. 1A-1B.

The memory device is formed of resistive memory cells $9_1, \ldots 9_4, 9_6, \ldots 9_n$ arranged on a support (not represented in FIGS. 1A-1B), such as a semiconductor substrate or semiconductor on insulator type substrate, advantageously a substrate on which one or more levels of components and possibly one or more levels of interconnections were also formed, the components (and if appropriate interconnections) being in this case disposed under the assembly of said cells.

Resistive memory cells are distributed, over several superimposed levels $N_1, N_2, \ldots, N_k$ or stages, into vertical columns of memory cells disposed on this support, each stage or level of cells including one or more horizontal rows of one or more resistive memory cells.

Figures 1A, 1B:
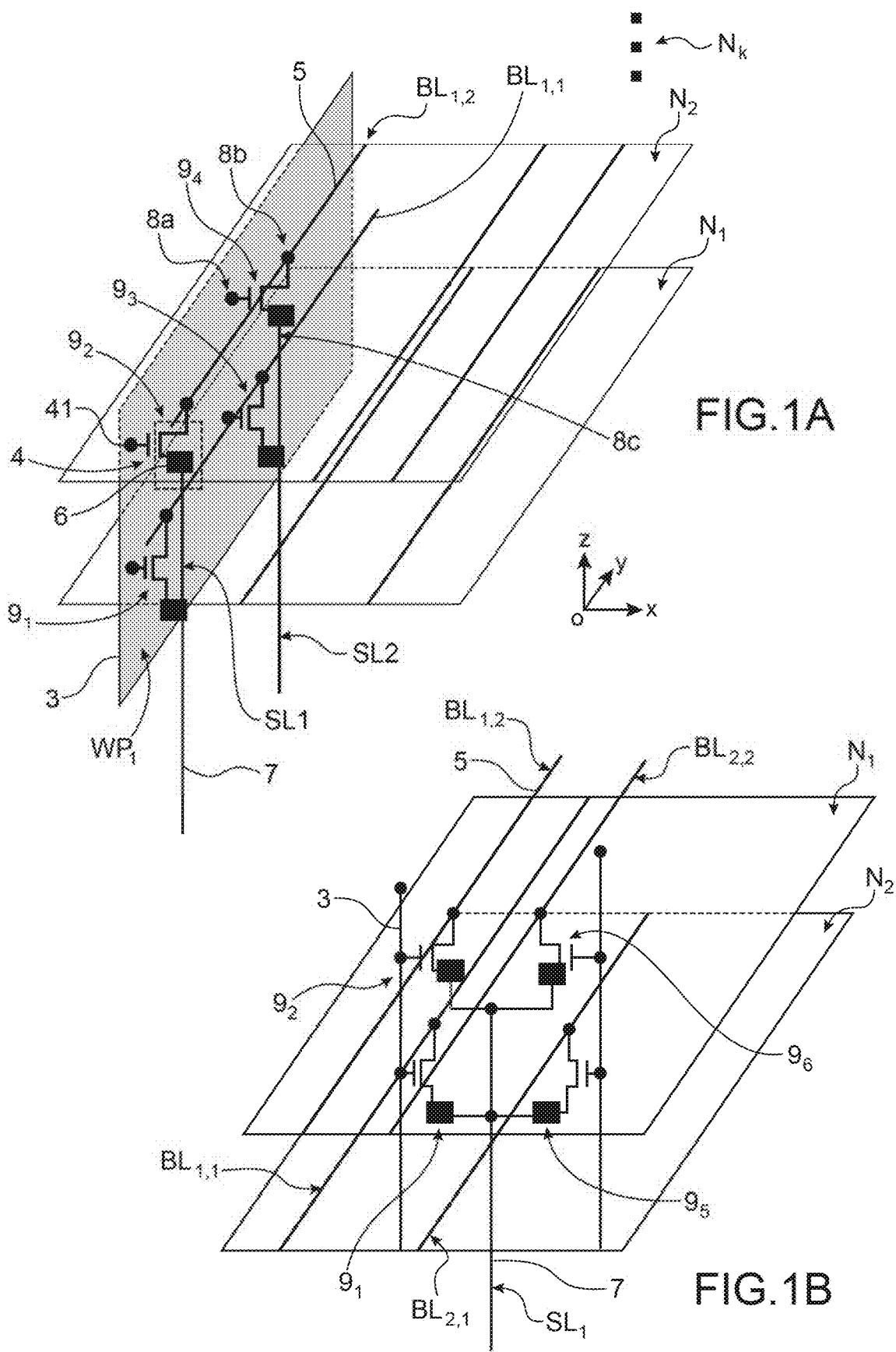
FIGS. 1A-1B, are used to illustrate an example of arrangement of a 3D memory device with resistive memory cells distributed over several levels and each formed of a memory element in series with a control transistor.

In the partial perspective view of FIG. 1A, horizontal rows of resistive cells of a first level $N_1$ and a second level $N_2$ are distributed along a direction parallel to the plane [O; x; y] and in particular to the axis y of an orthogonal reference frame [O; x; y; z]. Vertical columns of cells correspond to superimpositions of cells in a direction parallel to the axis z of this same reference frame.

Each memory cell $9_1, \ldots, 9_4$ is provided with at, least one adjustable resistance memory element 6 formed of a variable resistivity resistive material zone arranged between electrodes. The memory element 6 can be of the OxRAM type when the material disposed between the electrodes comprises a dielectric oxide.

In the case of a PCRAM type memory element 6, there can be one of both electrodes which is metallic but resistive, for example of TiN and provided for heating chalcogenide material disposed between electrodes, for example GeSbTe by Joule effect.

The memory element 6 is associated, and in this example interconnected in series, with at least one so-called "control" transistor 4. Depending on the way this control transistor is biased a current that this control transistor is likely to deliver to the memory element 6 can be modulated and a conduction state of the memory element 6 can thus be modified and as a result information stored in the corresponding memory cell containing this memory element 6 can be modified. In the same way, a read access to the stored information can be made, and an electric signal which is retrieved at a terminal of the memory element 6 can be generated, the level of this signal being then representative of a logical information stored in the memory element 6.

The control transistor 4 of a cell typically has at least its channel region formed in a semi-conducting layer belonging to a superimposition of semi-conducting layers (not represented in FIGS. 1A-1B) arranged on the support. The semi-conducting layers of this superimposition are preferably insulated from each other through intermediate insulating layers in order to form an electrical insulation between the different levels or stages of cells. Each intermediate insulating layer can thus be disposed between two semi-conducting layers in order to be able to form an insulation between two adjacent or neighbour levels.

Each cell $9_1, \ldots 9_4$, is in this example of embodiment provided with three control electrodes 8a, 8b, 8c respectively corresponding to a gate electrode of the control transistor 4, a source or drain electrode of the control transistor 4 and an electrode of the memory element 6, the other electrode of this element being connected to the drain or source of the control transistor 4.

The first control electrode 8a, in other words the gate of the control transistor 4 is interconnected with a conducting zone 3 which is called in this example "word plane" ($WP_x$).

Selecting a given memory cell in order in particular to perform a read or write operation on this cell, is made especially through a signal applied to a word plane with which the gate of the control transistor of this cell is interconnected or forming the gate of the control transistor of this cell.

Typically, the control transistors 4 of a same vertical column of cells share a same word plane and can thus have a common gate electrode or gate electrodes connected to each other and to a same word plane.

In the example of particular embodiment illustrated in FIG. 1A, for the sake of simplicity, only two levels $N_1$, $N_2$ of cells $9_1, 9_2, 9_3, 9_4$, and only one word plane are represented. An arrangement with a first word plane $WP_1$ associated with several juxtaposed vertical columns of cells $9_1$, $9_2$, and $9_3$, $9_4$ is provided. The respective control transistors 4 of these cells $9_1, 9_2, 9_3, 9_4$ thus have a common gate electrode or respective gate electrodes connected to each other and to a same first word plane $WP_1$. The memory typically includes other distinct word planes (not represented in FIG. 1A) and which can be electrically controlled independently of one another. Each word plane is associated with a group of cells formed of a superimposition of horizontal rows of cells or of a juxtaposition of vertical columns. In the example illustrated in FIG. 1A, the superimposition or juxtaposition forming a group of cells interconnected with a same word plane $WP_1$ extends substantially parallel to the plane [O; y; z].

As an alternative (not represented) of the illustrated example, an arrangement with one word plane per vertical column of cells can be provided.

The second electrode 8b of the cells of a same horizontal row of cells of a same level is typically interconnected with or connected to a same horizontal bias conducting line 5 from a plurality of horizontal bias lines which are here called "bit lines" ($BL_{x,z}$). The horizontal bias conducting lines 5 extend parallel to the main plane of the support and in this example parallel to the plane [O; x; y].

Thus, in the example illustrated in FIG. 1A, the cells $9_1$, $9_3$ of a same horizontal row of the first level $N_1$ are connected to a first bit line $BL_{1,1}$, whereas the cells $9_2, 9_4$, of a same horizontal row of the second level $N_2$ are connected to a second bit line $BL_{1,2}$, distinct from the first bit line $BL_{1,1}$ and which can be electrically controlled independently of the first bit line $BL_{1,1}$.

The third respective electrodes 8c of cells of a vertical column of cells belonging to different levels are typically interconnected with or connected to a same vertical bias conducting line 7 from a plurality of vertical bias conducting lines which are here called "source lines" ($SL_y$).

Thus, in the illustrated example, the first cell $9_1$, and second cell $9_2$, are connected to a same first source line $SL_1$, whereas the third cell $9_3$ and fourth cell $9_4$ are connected to a same second source line $SL_2$, distinct from the first source line $SL_1$ and which can be electrically controlled independently of the first source line $SL_1$.

A particular arrangement provides cells of a same level connected to a same source line also shared by other cells of different levels. Thus, in the partial view of FIG. 1B, the first cell $9_1$ and a fifth cell $9_5$ both belonging to the first level $N_1$ and respectively to a first horizontal row and a second horizontal row of cells, are connected to the same source line $SL_1$. The second cell $9_2$, and a sixth cell $9_6$ located on a same vertical column as the fifth cell $9_5$, are connected to this same source line $SL_1$.

The number of levels, of rows and of cells per row can be different and in particular much greater than that of the illustrated example of embodiment.

Figure 2:
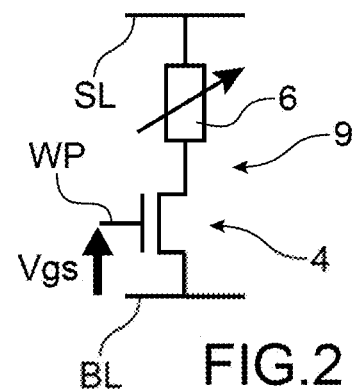
FIG. 2 gives an example of an equivalent wiring diagram of a resistive memory cell likely to be integrated into a 3D memory device such as implemented according to the invention.

FIG. 2 gives an equivalent wiring diagram of a resistive memory cell 9 likely to be integrated into a 3D memory device with superimposed stages such as implemented according to an embodiment of the present invention.

A write operation on this cell 9 can be implemented for example by applying, on a source line SL to which this cell 9 is connected, a potential VSL=Vset, such that Vset>0V and by making its control transistor 4 on, by applying a potential VWL>0V on the word plane WP connected to the gate of this transistor and by applying a potential VBL equal to a ground GND potential on the bit line BL connected to the source of the control transistor 4.

An erase operation on this cell 9 can be implemented for example by putting the source line SL to ground potential VSL=GND and by applying a potential VBL=Vreset>0V on the bit line BL. To perform erasing, the word plane WP can in turn be activated by applying a potential VWL>0V.

A read operation on the cell 9 can be performed for example by putting the source lime SL to a potential VSL=Vread>0V and by applying a potential VBL=GND. Upon reading the cell 9, the word plane WP is then also activated by applying a potential VWL>0V.

Biasing the control transistor 4 is provided so that the current it delivers is lower during read operations than during write operations. In this example, Vset>Vread is therefore provided.

For a not selected cell interconnected with a word plane which is not interconnected with any selected cell, and therefore on which no above-mentioned write, erase, read operation is made, this word plane is provided not to be activated, by thus typically applying a potential VWL=0 or by letting the word plane to the ground (GND).

For a not selected cell but which is interconnected with a word plane itself interconnected with at least one selected cell (on which a write or erase or read operation is performed), this word plane is provided to be activated by thus applying thereto a potential VWL≠0V. The respective potentials of the source line and bit line at the ends of the cell are typically equal (VSL=VBL) so as to prevent a current from flowing through the cell.

For a not selected cell but which shares a source line with one or more selected cells, there can be respective potentials of the source line and bit line at the ends of the cell which are different (VSL≠VBL), the word plane of this cell being not activated (VWL=0V).

An example of a method for making a 3D resistive memory device will now be given.

A possible starting structure for the method is a support 10 of the bulk substrate type or in the form of a semiconductor on insulator type substrate, for example SOI (Silicon On Insulator).

Advantageously, a support formed of a substrate on which at least one stage of transistors has already made, can first be used. Transistors then typically have at least their channel region which extends in a semi-conducting layer of the substrate.

The stage of transistors can itself be covered with at least one stage of interconnections. The method for making the memory device can in this case be integrated into a part of the method for making a microelectronic device commonly called "back-end".

Figure 3A:
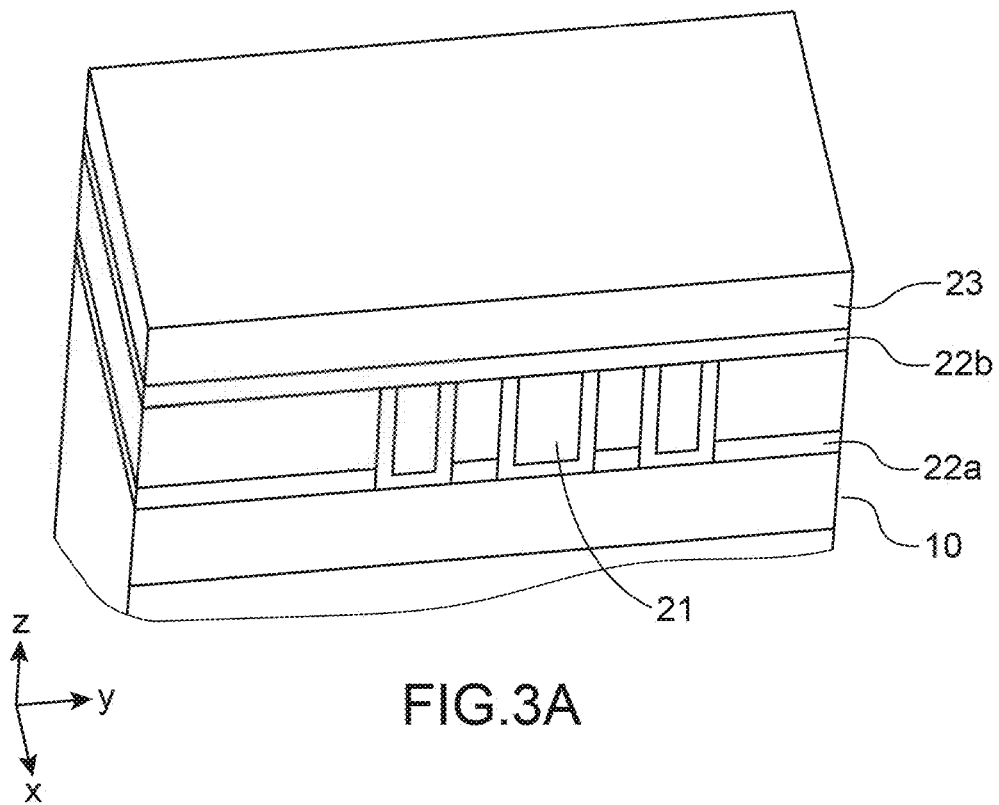
FIGS. 3A-3J, 4, 5A-5C illustrate an example of a method for making a 3D memory device with superimposed resistive memory cells.

On the support 10, making one or more horizontal conducting lines 21, in other words which extend parallel to the main plane of the support (FIG. 3A), can be provided. By "main plane" of the support, it is meant a plane passing through the support and which is parallel to the plane [O; x; y] of the orthogonal reference frame [O; x; y; z]. This or these horizontal conducting lines 21 are called "routing" lines. A routing line 21 enables several vertical bias conducting lines to be connected to each other, in other words lines which are not parallel to the main plane and typically extend orthogonally to the main plane of the support or in a direction parallel to the axis z of the orthogonal reference frame [O; x; y; z]. The routing lines 21 are for example of metal such as copper. In this case, the routing lines 21 can be encapsulated through copper diffusion barrier layers. For this, making routing lines 21 between a first and a second diffusion barrier dielectric layers 22a, 22b, for example based on SiCN nitride, can be provided.

Figure 3B:
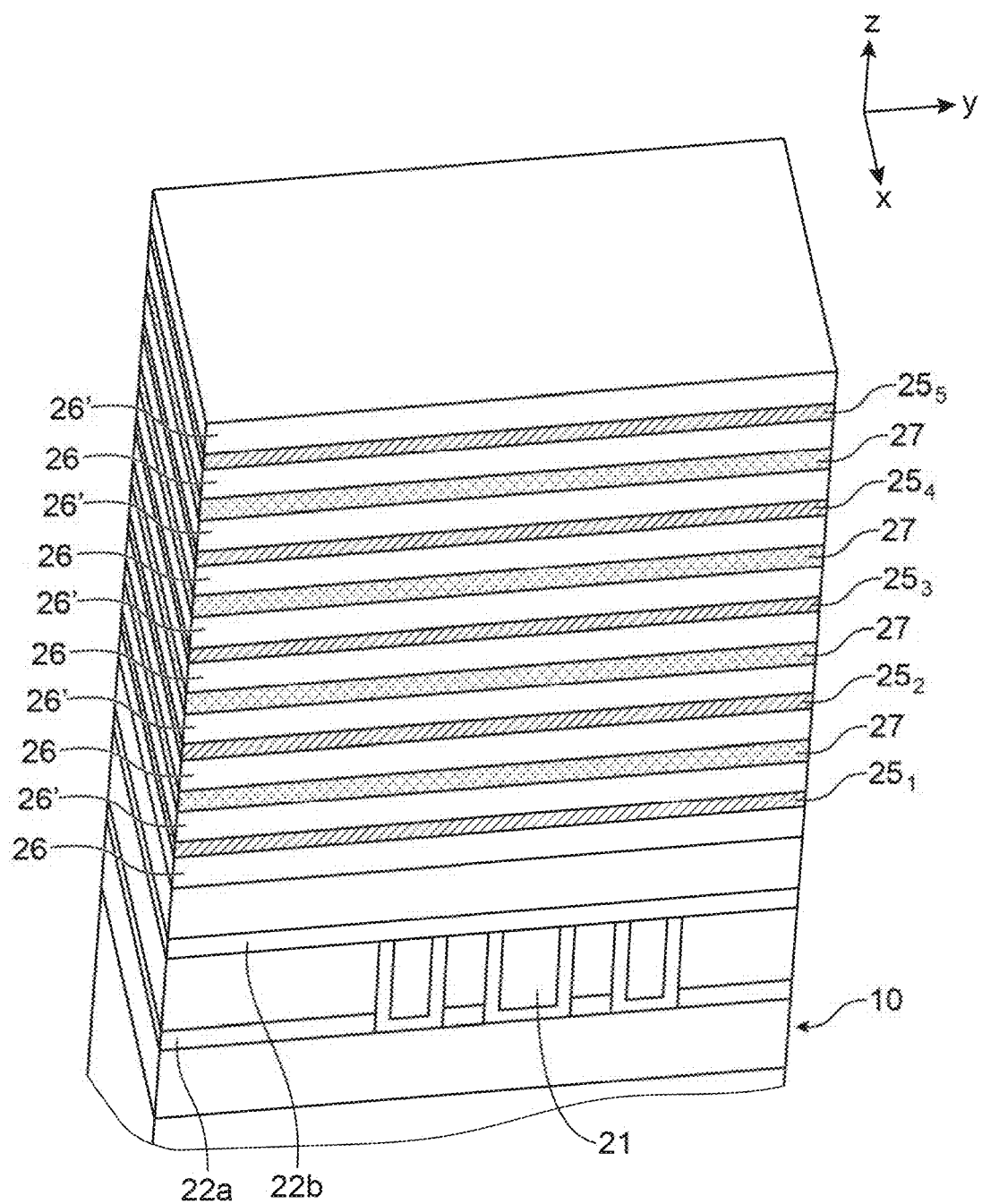

Subsequently (FIG. 3B), a stack of layers is formed, comprising a superimposition of semi-conducting layers $25_1$, $25_2$, $25_3$, $25_4$, $25_5$ from which control transistors are capable of being formed and in which respective channel regions of these control transistors are in particular provided. The semi-conducting layers $25_1$, . . . , $25_5$ are for example of silicon. As an alternative, it is also possible to choose a material III/V or two-dimensional material of di-chalcogenide transition metal type such as for example $MoS_2$.

The semi-conducting layers $25_1$, . . . , $25_5$, can be deposited in an amorphous form, for example through CVD (Chemical Vapour Deposition) and then made crystalline through laser annealing operation(s). Crystallisation annealing can occur after each deposition or after performing all the depositions. With such an annealing type, highly localised heating of a semi-conducting layer is implemented while limiting heating of underlying parts of the stack in progress. The stack of layers $25_1$, . . . , $25_5$ is preferably made by limiting the thermal burden for the first level $N_1$, preferably lower than 450° C. or 550° C. in order not to degrade the support, and in particular to prevent an unwanted diffusion of dopants in underlying layers or a possible degradation of interconnections or a phase change to a more resistive phase of siliconized zones, for example of NiSi, already manufactured.

In situ doping of the layers $25_1$, . . . , $25_5$, in other words performed during their deposition, can be implemented. This type of doping can especially be performed when making junctionless type control transistors is provided.

The different levels of semi-conducting layers $25_1$, $25_2$, $25_3$, $25_4$, $25_5$ are insulated from each other through intermediate insulating layers 27, of a dielectric material such as for example silicon nitride (SiN).

To facilitate the subsequent making of horizontal and/or vertical bias conducting lines, and enable the connection of these lines with the different semi-conducting layers of said superimposition of semi-conducting layers $25_1$, . . . , $25_5$ to be made easier, arranging semi-conducting layers $25_1$, . . . , $25_5$, between sacrificial material layers 26, 26' is provided. The sacrificial material can be a semiconductor material different from that of semi-conducting layers $25_1$, . . . , $25_5$, and which can be selectively etched relative to the semi-conductor material of the layers $25_1, \ldots, 25_5$. For example, SiGe sacrificial layers 26, 26' can be provided when the semi-conducting layers $25_1, \ldots, 25_5$, are of Si.

The stack made can have a thickness for example in the order of several hundreds of nanometres. Once this stack is formed, one or more source lines, memory elements, one or more bit lines as well as gates and/or word planes of the control transistors can be made.

In the example illustrated in FIGS. 3C to 3F, one or more vertical bias conducting lines 7 are formed, in particular source lines SL to which memory elements are for being connected.

Figure 3C:
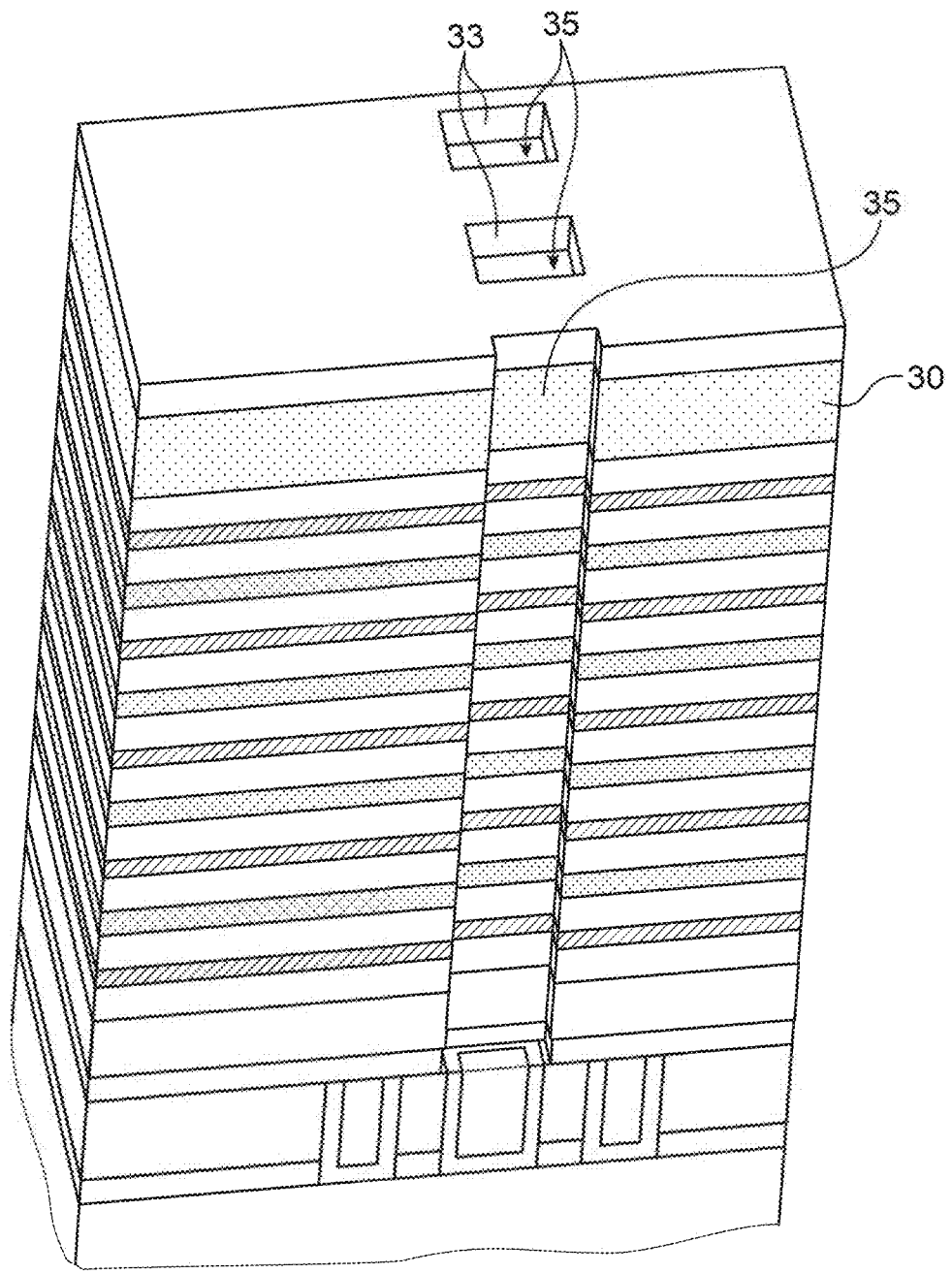

For this, one or more holes 35 passing through the stack of layers are made (FIG. 3C). The holes 35 can be each provided to accommodate a conducting pillar vertical structure. In this example of embodiment, a conducting pillar vertical structure includes a column of resistive memory elements.

Figure 3D:
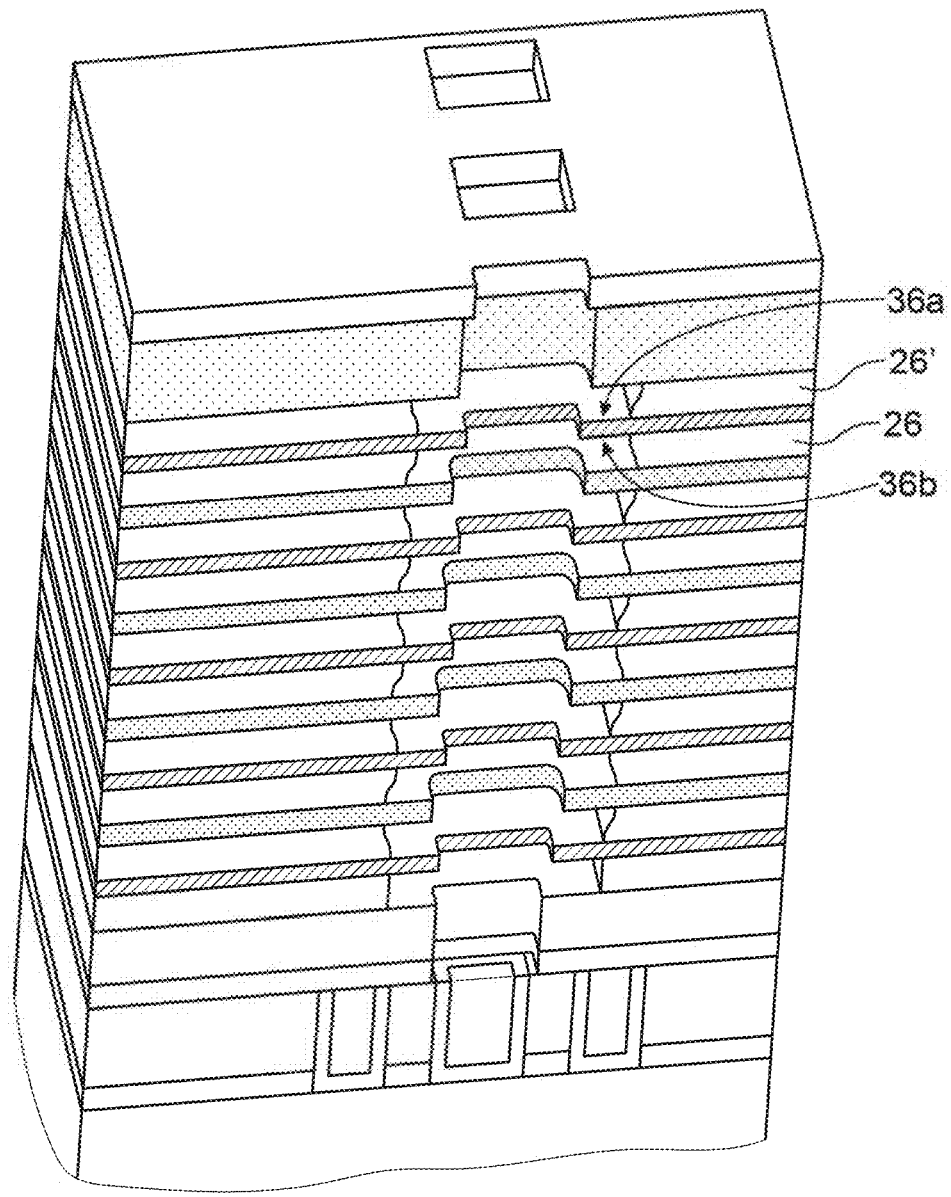
Figure 3E:
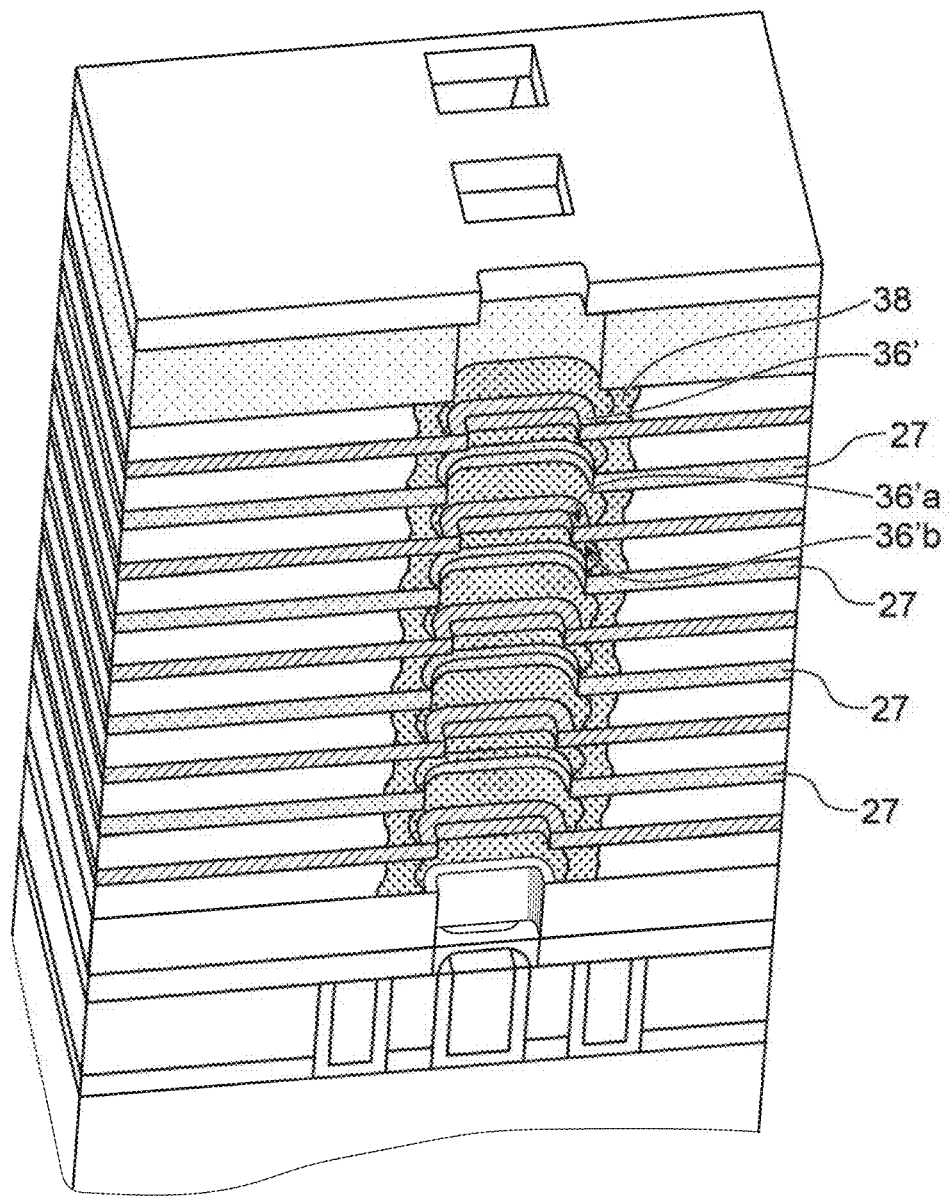
Figure 3F:
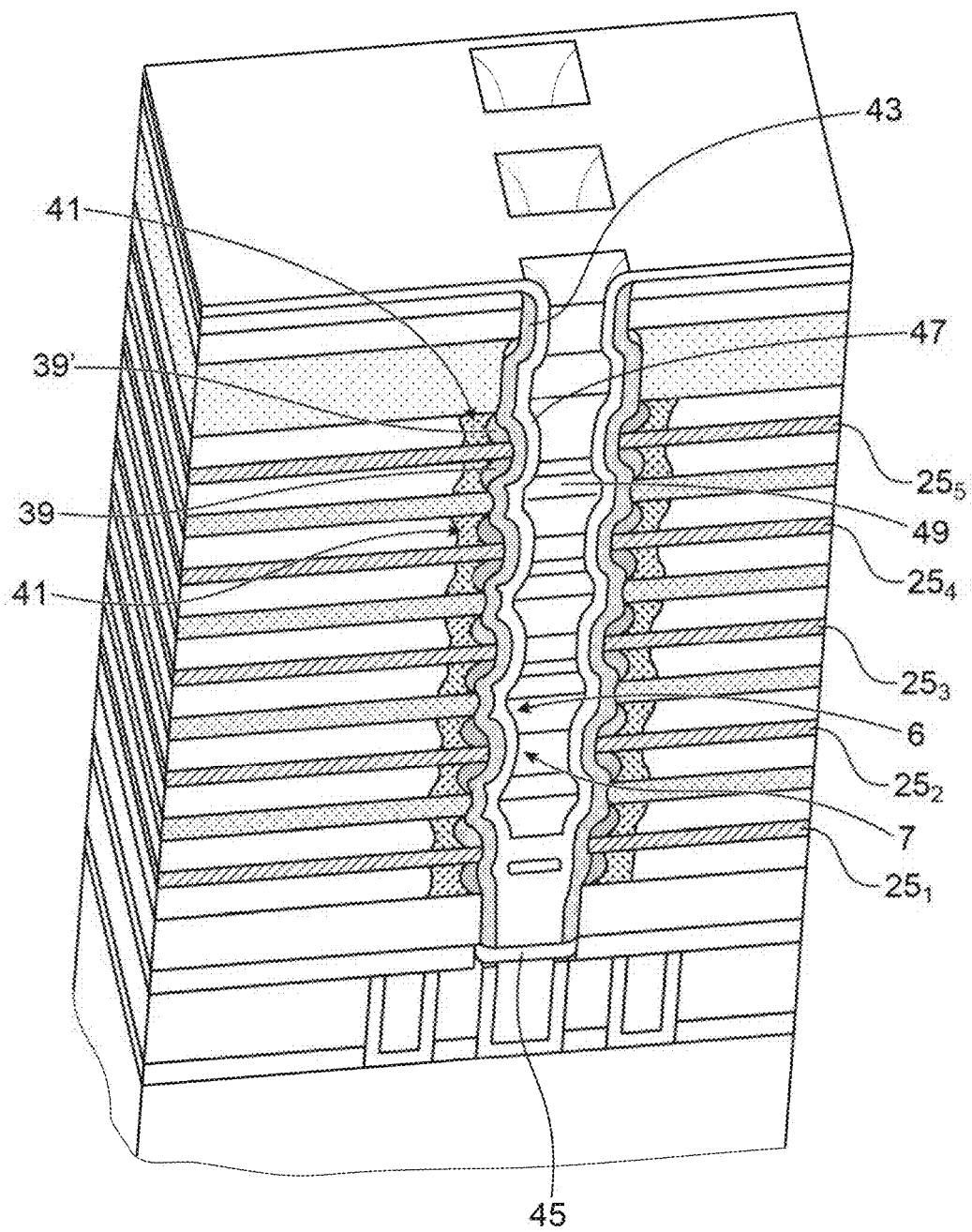

To make the holes 35, a hard mask 31 is typically formed, for example comprising a TiN layer in which one or more apertures 33 are made. Through the aperture(s) 33, the stack is then etched. The vertical holes 35 are made so that at least one hole 35 reaches and reveals a routing line 21. The hard mask 31 can be implemented on a dielectric material layer 30, for example a nitride layer covering the stack. For revealing zones 36a, 36b of an upper face and a lower face respectively of the semi-conducting layers $25_1, \ldots, 25_5$, isotropic selective etching of the sacrificial material of the layers 26, 26' is then performed, with respect to that of the semi-conducting layers $25_1, \ldots, 25_5$ (FIG. 3D).

Preferably, a selective etching method for intermediate insulating layers 27 which are in this example of nitride, is also chosen. For example, when the sacrificial layers 26, 26' are of SiGe, and the semi-conducting layers $25_1, \ldots, 25_5$ of Si, this selective etching can be made using an RIE (Reactive Ion Etching) etching in chemistry $CF_4$ for example or in chemistry by acetic acid type solution.

Selective etching enables spaces corresponding to etched portions of the sacrificial layers 26, 26' and communicating with the holes 35 to be freed.

Partially covering the revealed zones 36a, 35b of the semi-conducting layers $25_1, \ldots, 25_5$ with inner insulating spacers 38, for example of SiCO, can be provided, while allowing regions 36'a, 36'b of the upper face and lower face respectively of the semi-conducting layers $25_1, \ldots, 25_5$ to protrude.

On these regions 36'a, 36'b, a first electrode 41 is then formed for the resistive memory elements. This first electrode 41 can be made through metallizing and/or forming a semiconductor and metal alloy, in particular a silicide, typically made through metal deposition, for example Ni or Ti or Co, followed by annealing for example made in a furnace or using a laser. For example, the first electrode 41 can comprise an NiSi type silicide layer, such a silicide having the advantage of being able to be used at a temperature lower than 550° C. Another example of embodiment provides a first TiN electrode 41.

The first electrode 41 made can thus be formed of metal or metal and semiconductor alloy regions 39, 39' respectively distributed on a region 36'a of the upper face of the semi-conducting layers $25_1, \ldots, 25_5$, and on a region 36'b of the lower face of these same semi-conducting layers $25_1, \ldots, 25_5$.

In this example of embodiment, the material of the first electrode 41 does not form a continuous zone along the wall of the holes 35, but is interposed between the semi-conducting layers $25_1, \ldots, 25_5$ and insulating layers 27. Thus, the first respective electrodes 41 of the different resistive memory elements are insulated from each other especially through the insulating layers 27.

And then, at least one resistive material layer 43 lining the walls of the holes 35 is deposited in order to make the inter-electrode material of the memory elements. This inter-electrode material 43 can be a dielectric material and in particular a dielectric oxide such as $HfO_2$ or tantalum oxide ($TaO_x$). Depositing the material 43 is typically followed by a step of anisotropic etching in order to remove this material 43 at the bottom of the hole 35, which enables a routing line 21 disposed at the bottom of this hole 35 to be revealed.

The second electrode 47 of the resistive memory elements 6 is then formed. This second electrode 47 can be formed of a conducting material or a stack of different conducting materials. This second electrode 47 can be formed through metal deposition, for example of Ti or TiN. The second electrode 47 typically has a different composition from that of the first electrode 41 and can thus be formed of a layer (or a stack of layers) of a different composition from that of the second electrode 47.

Thus, examples of compositions of memory elements provide the first electrode 41, resistive material 43, second electrode 47, of NiSi, $HfO_2$, TiN respectively, or TiN, $HfO_2$, TiN respectively, or TiN, $TaO_x$, TiN respectively.

In the case where OxRAM type memory elements are made, a reactive electrode creating a gap of oxygen, for example of Ti, is preferably provided as the second electrode 47.

Once the memory elements are made, a vertical bias conducting line 7 can be formed in the hole, for example a source line SL connected to several memory elements 6. For this, the hole 35 is filled and the central part of the hole 35 is filled using a conducting material which thus forms a conducting line 7 in contact with the second electrode 47 of memory elements distributed on different levels. For example, this filling is made using W.

Removing materials deposited to make the memory elements 6 and the bias line protruding from the mouth of the hole(s) 35 is then performed. This can be made for example through CMP polishing (Chemical Mechanical Polishing or Chemical Mechanical Planarization). The hard mask which has been used to make the hole(s) 35 is then typically removed.

One or more horizontal bias conducting lines 5, for example bit lines common to control transistors of a same level and to a same row of control transistors, can also be formed.

For this, trenches 51a, 51b can be first formed on either side of the stack of layers 26, $25_1$, 26', 27, $\ldots$, $25_5$ and running along opposite side faces of this stack.

To enable edges 56 of the semi-conducting layers $25_1, \ldots, 25_5$ to be revealed, selective etching of the sacrificial material of the layers 26, 26' is then performed with respect to the semi-conducting layers $25_1, \ldots, 25_5$, and also preferably with respect to the insulating layers 27 which are of nitride in this example. Edges 56a, 56b, of an upper face and lower face respectively of the semi-conducting layers $25_1, \ldots, 25_5$, are thus uncovered.

Subsequently (FIG. 3G), partially covering these edges 56a, 56b with so-called insulating spacers 58, for example of SiCO, can be provided, while allowing regions 56'a, 56'b of the upper face and lower face of the semi-conducting layers $25_1, \ldots, 25_5$ to protrude.

Subsequently on these regions 56'a, 56'b protruding from the superimposition of layers, horizontal conducting lines 5 are formed. In the illustrated example, these conducting lines 5 are arranged as pairs of lines 59a, 59b, which extend on the upper face and on the lower face respectively of the semi-conducting layers $25_1, \ldots, 25_5$.

In the particular illustrated example of embodiment, each of the lines 59a, 59b of the pair can be formed of a stack of materials with for example a siliconized part 61 of NiSi or of Co and Si alloy formed in contact with the semi-conducting layers and covered with a metal material 62 such as for example of tungsten W.

Figure 3G:
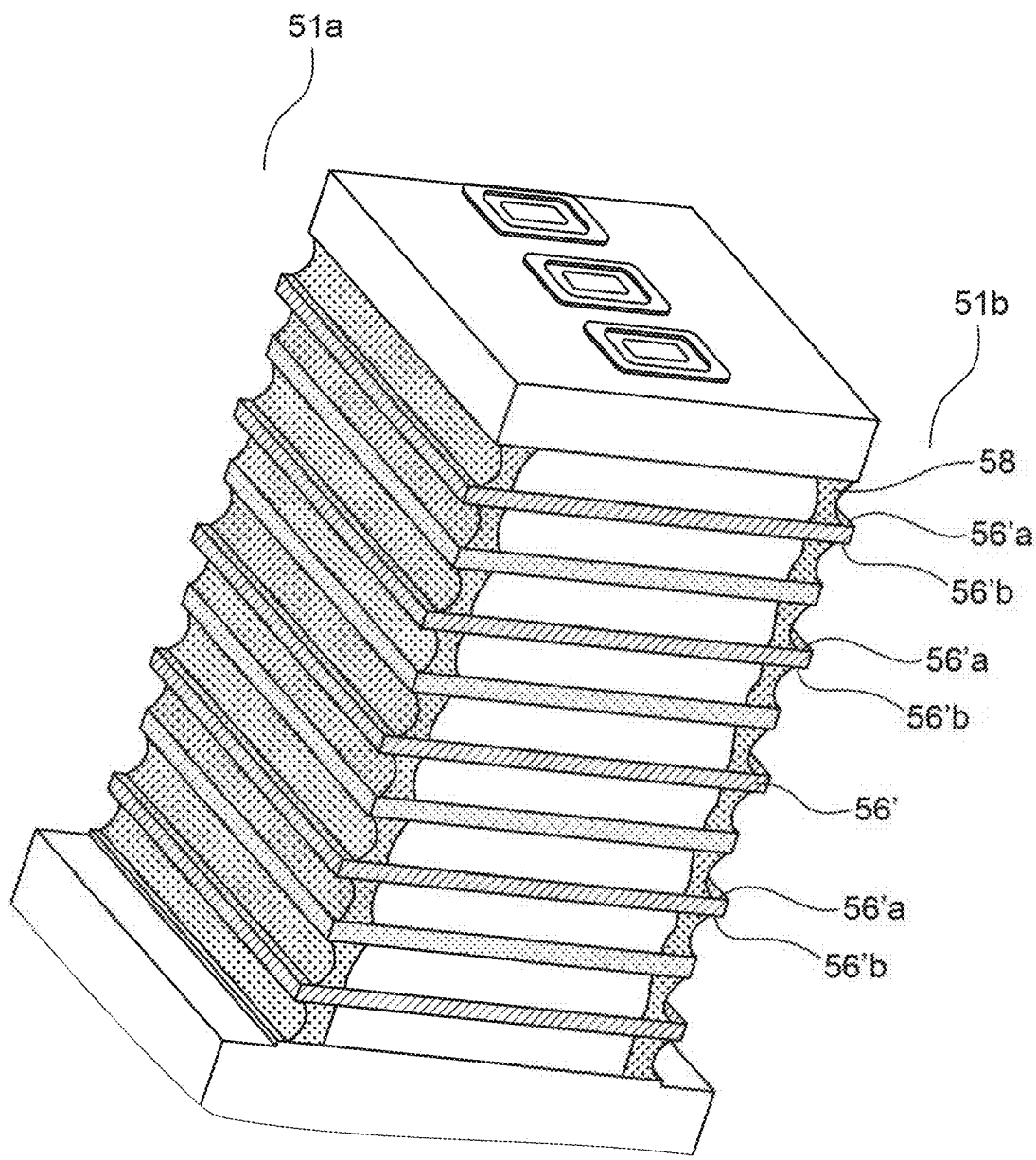
Figure 3H:
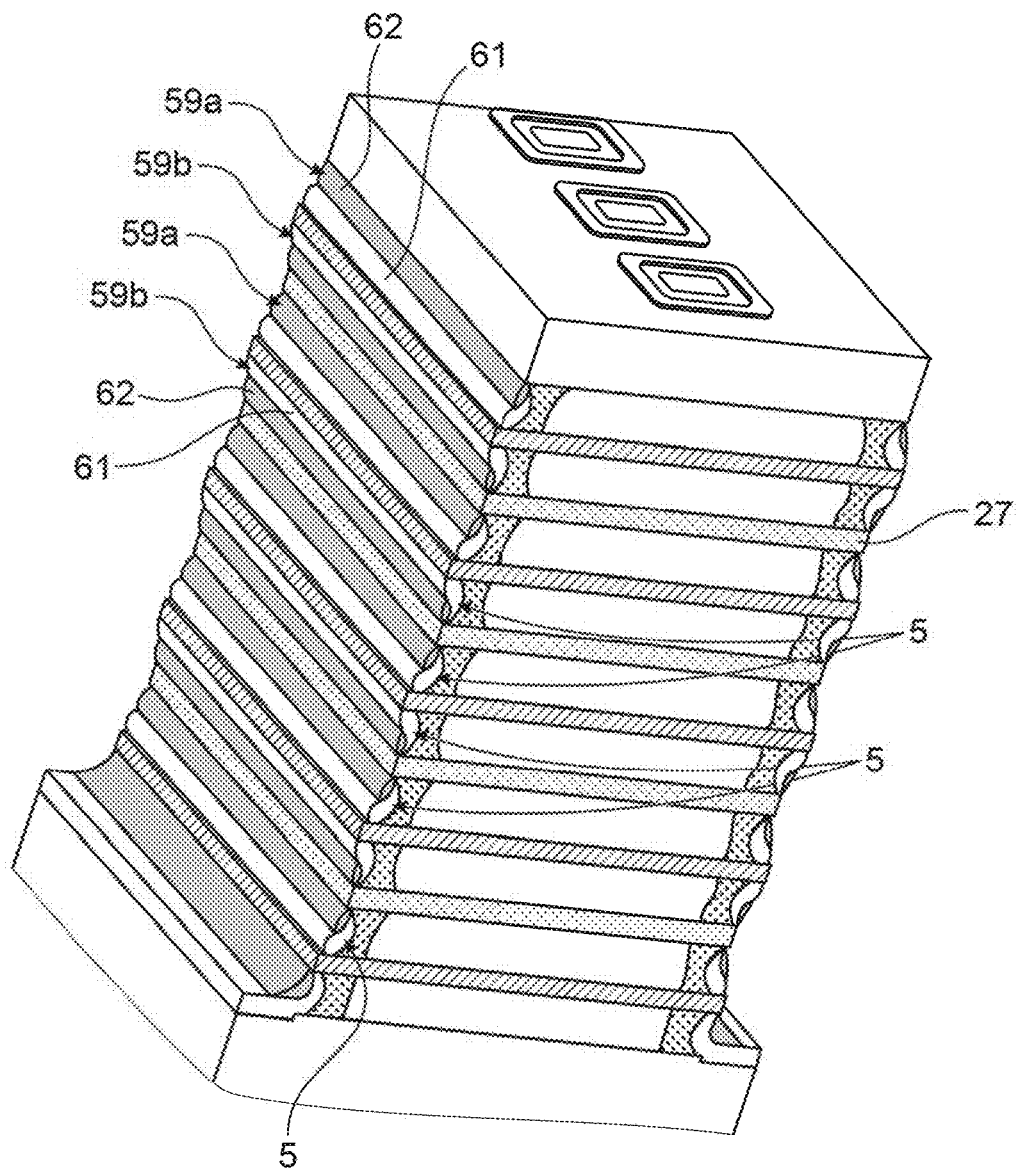

The conducting lines 5 or pairs of conducting lines 59a, 59b are insulated from each other through inter-level insulating layers 27 and can form bit lines BL (FIG. 3H).

An insulating protective dielectric material such as for example SiOCH can subsequently be deposited in the trenches in order to cover the superimposition of horizontal conducting lines 59. Removing portions of this excess material protruding from the mouth of the trenches can then be subsequently provided and made for example through CMP.

The first sequence of steps of making the vertical structure described in connection with FIGS. 3C to 3F and the second sequence of steps of making horizontal bias conducting lines 5 described in connection with FIGS. 3G-3H can be inverted, as previously suggested.

According to another alternative, some similar steps of the first and second sequences of steps can even be advantageously pooled.

Thus, selective etching of the sacrificial layers 26, 26" of the stack resulting in edges 56 of the semi-conducting layers $25_1, \ldots, 25_5$ being freed, can for example be provided at the same time as that of the zones 36 of these layers $25_1, \ldots, 25_5$.

Making inner spacers 38 and 58 can also be performed at the same time, by depositing a dielectric material in freed spaces by etching sacrificial layers 26, 26', and then etching this dielectric material.

Similarly, forming the horizontal conducting lines 5 and forming the first electrodes 41 of the memory elements can possibly be pooled, in particular, when making these conducting lines 59 and first electrodes 51 provides a step of siliconizing for forming a metal and semiconductor alloy for example on parts of the layers $25_1, \ldots, 25_5$ revealed by selective etching of the sacrificial layers 26, 26' and which are not covered with an insulating spacer.

Insulation trenches can be formed in order to separate the stack into several distinct blocks insulated from each other.

Figure 3I:
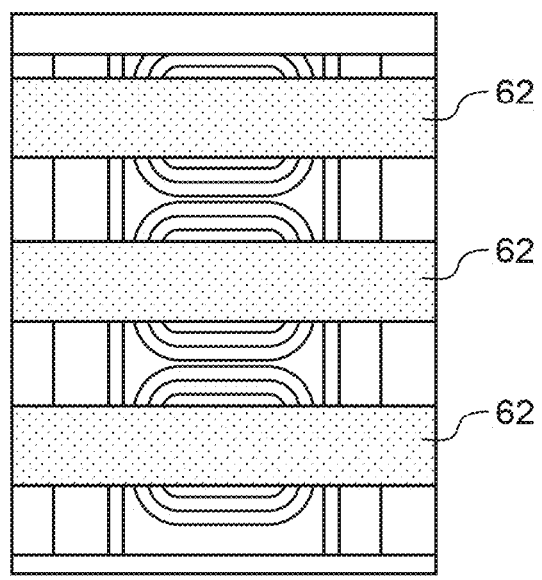

The insulation trenches are typically formed using an etching method during which, the vertical structure(s) the making of which was previously described in connection FIGS. 3C-3F, is/are covered and protected using a masking 62 for example of resin (FIG. 3I).

Figure 4:
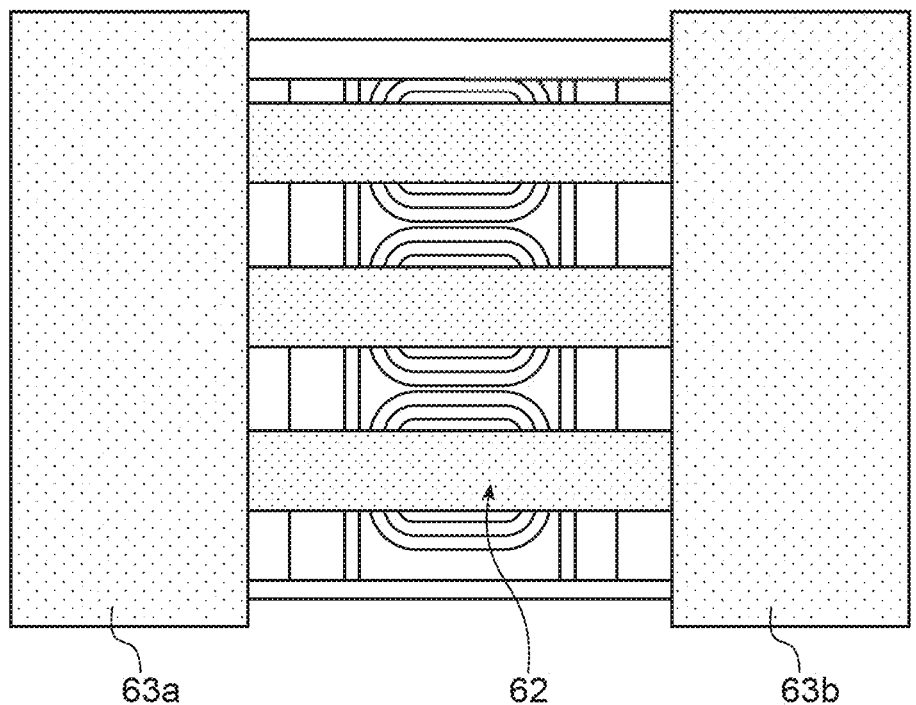

To enable the horizontal conducting lines 5 to be also protected, the masking 62 can also be provided, as in FIG. 4, with parts 63a, 63b covering faces of the stack on which the conducting lines 59 are disposed.

Once the trenches are made, they are filled with at least one insulating material 71 such as for example SiOCN, The insulation trenches 73 thus made enable adjacent blocks of the stack each formed of a superimposition of semi-conducting layers $25_1, \ldots, 25_5$ to be separated and insulated two by two.

Figure 3J:
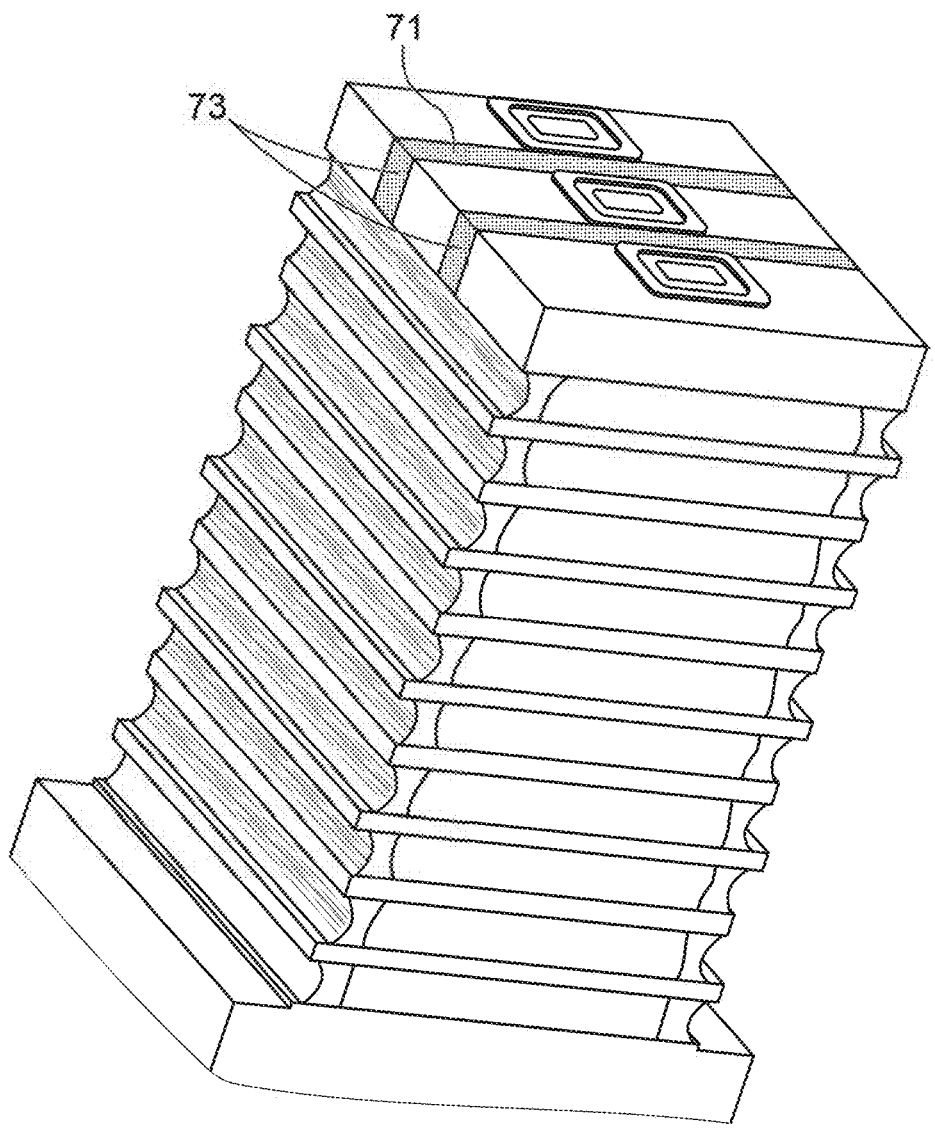

Thus an insulation is made for a superimposition of transistors provided in a given block of the stack and another superimposition of transistors provided in another block of the stack adjacent to said given block (FIG. 3J).

To make a gate structure for control transistors and form one or more gate bias conducting zones 3 or one or more word planes WP, masking including one or more apertures is formed from a stack such as previously described.

Figure 5A:
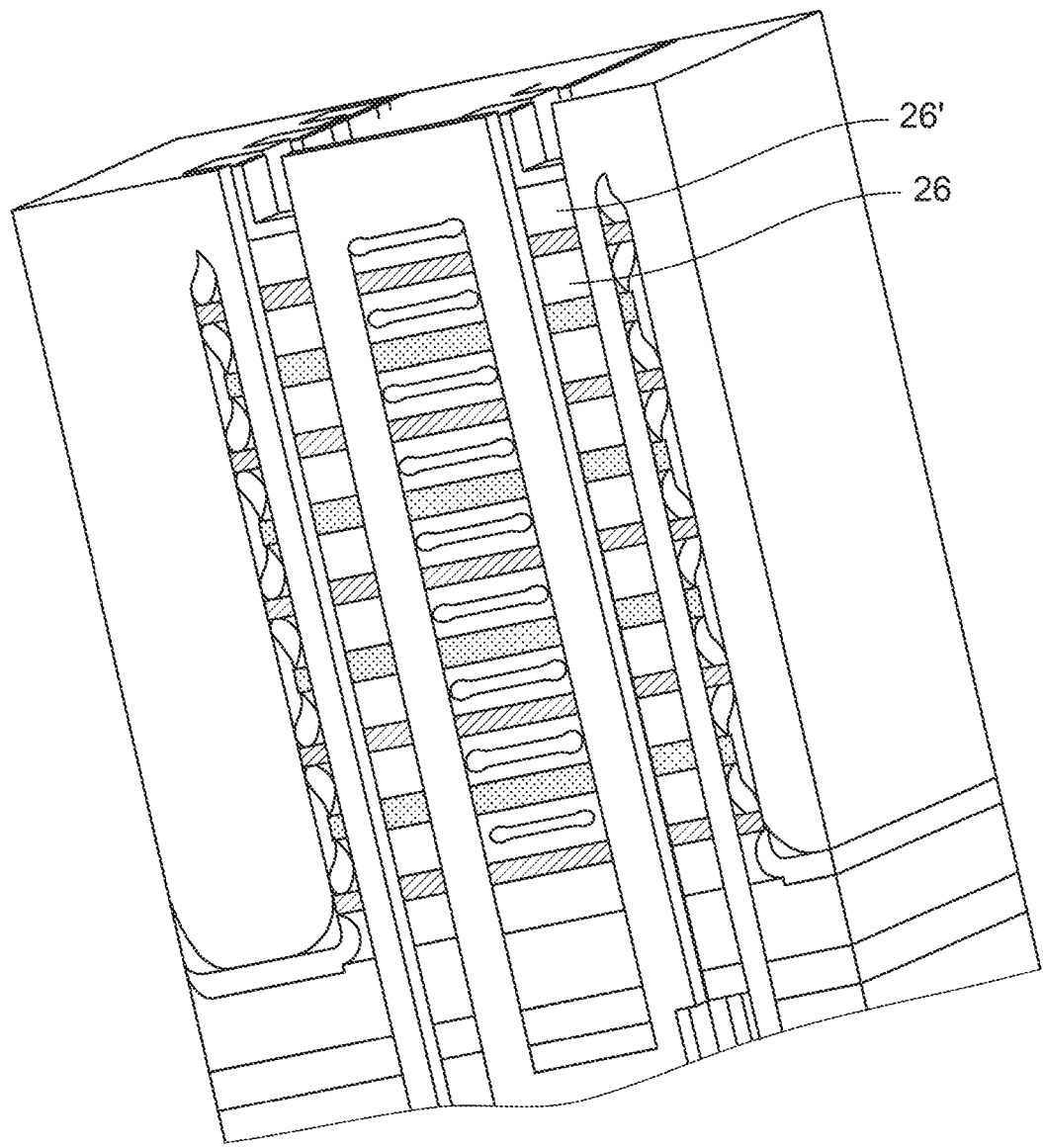
Figure 5B:
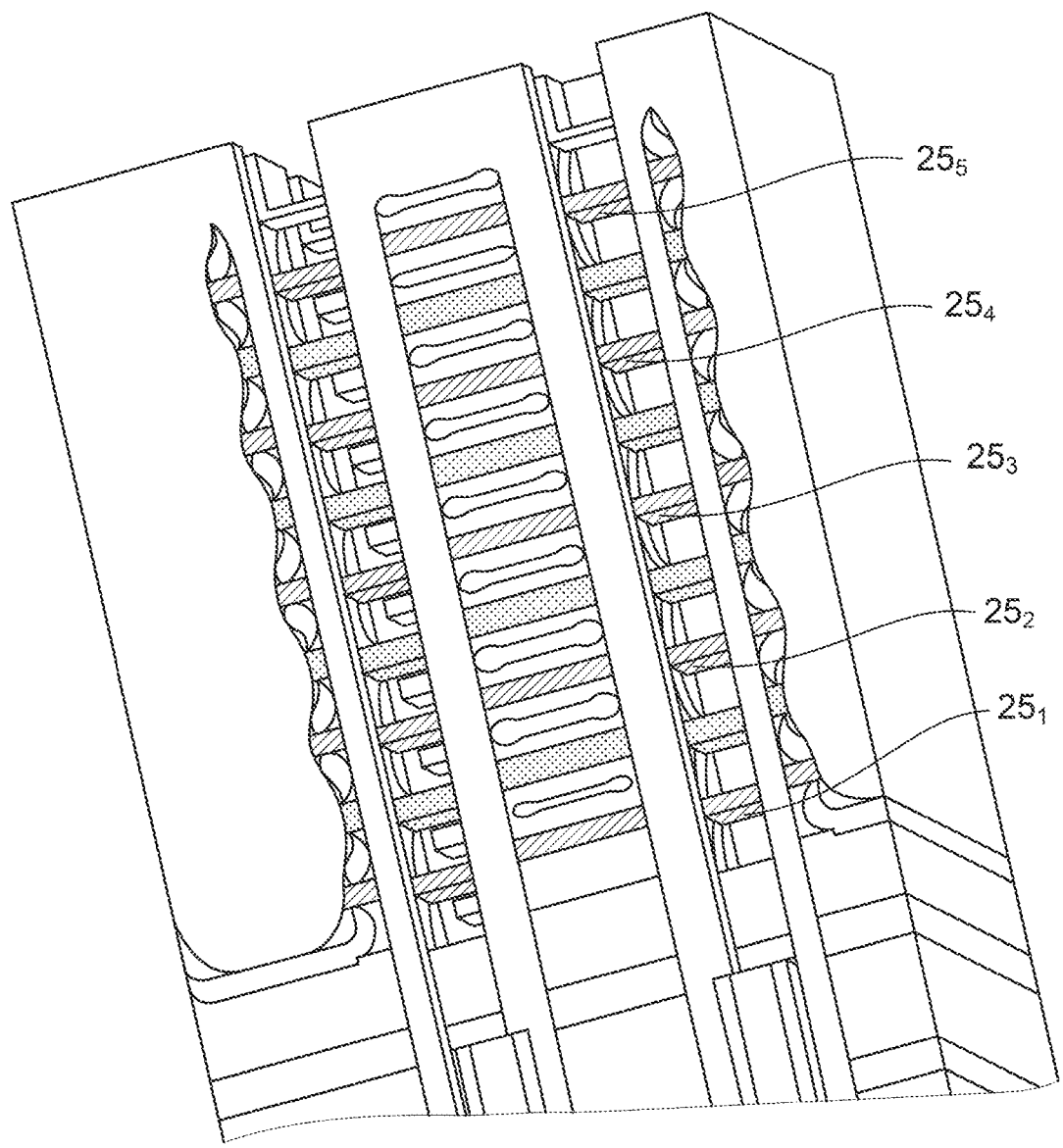

Then, selective etching of the sacrificial layers 26, 26' (visible on FIG. 5A) of the stack is performed through the aperture(s) of this masking. Removing the sacrificial layers can be implemented so as to free a space around and reveal the upper face, lower face, and side regions of the semi-conducting layers $25_1, \ldots, 25_5$ (FIG. 5B).

Figure 5C:
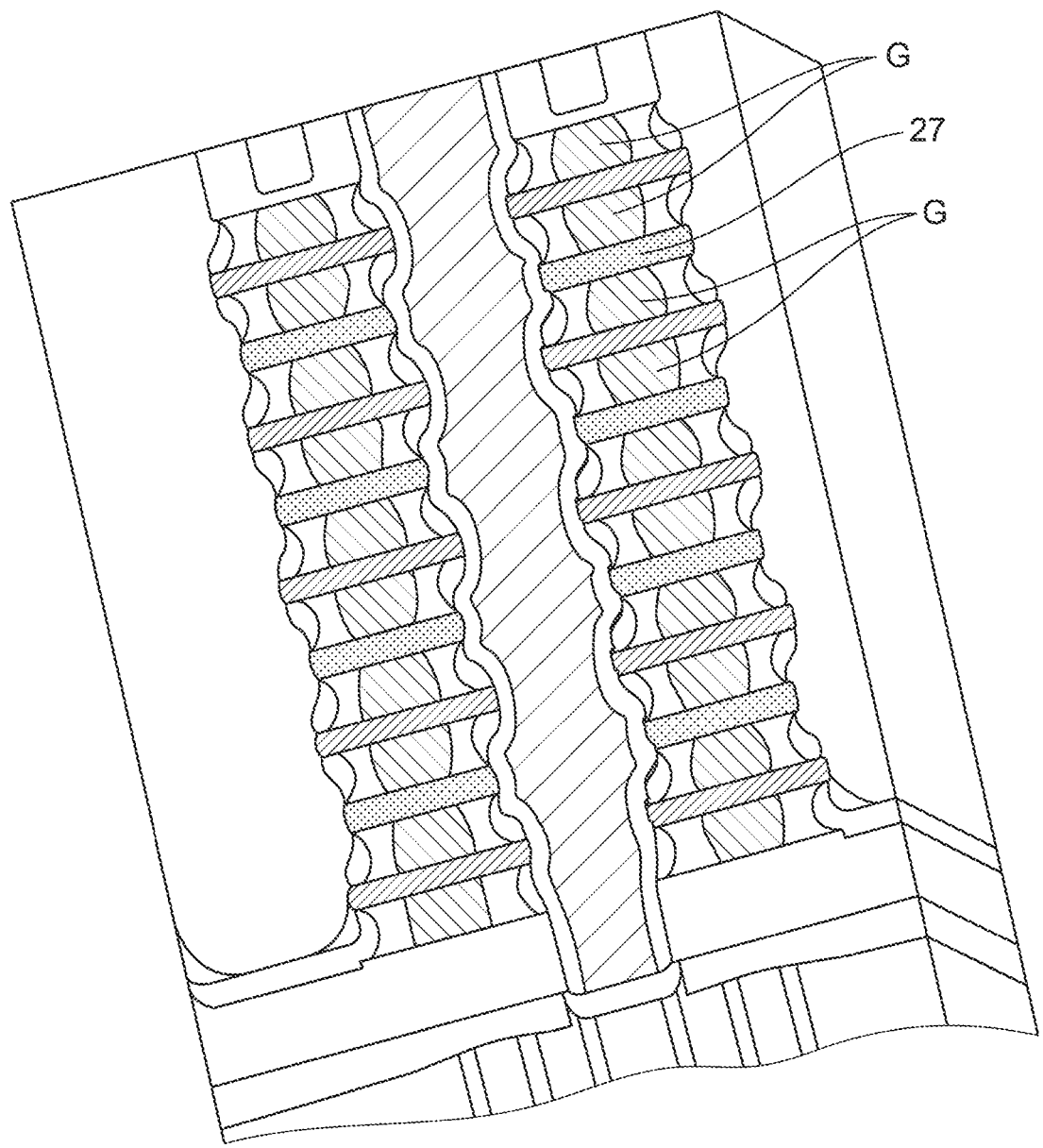

And then, in the aperture(s) a gate structure G is formed, which can form a dual gate extending on the upper face as well as on the lower face of the semi-conducting layers $25_1, \ldots, 25_5$ (FIG. 5c). The gate structure made can even be a gate-all-around structure when side regions of the semi-conducting layers $25_1, \ldots, 25_5$ are also covered with the gate structure.

According to a particular example of embodiment, it can be provided to impart a stepped profile with a plurality of steps respectively forming contacting zones to a stack such as previously described and comprising the superimposition of semi-conducting layers $25_1, \ldots, 25_5$. Such a profile can be used in particular to facilitate making distinct vertical contacts (not represented) on the horizontal bias lines 5 which can be for example bit lines. Document U.S. Pat. No. 9,053,976 from the Applicant gives examples of embodiment of such a stepped profile. In such a stepped structure, insulating spacers can be provided to insulate the semi-conducting layers from each other and bias lines from each other.

According to a particular example of embodiment, in order to make a connection of vertical bias conducting lines, as an alternative to or in combination with routing lines provided under the stack, horizontal routing lines can be provided, this time disposed on the stack.

Figure 6:
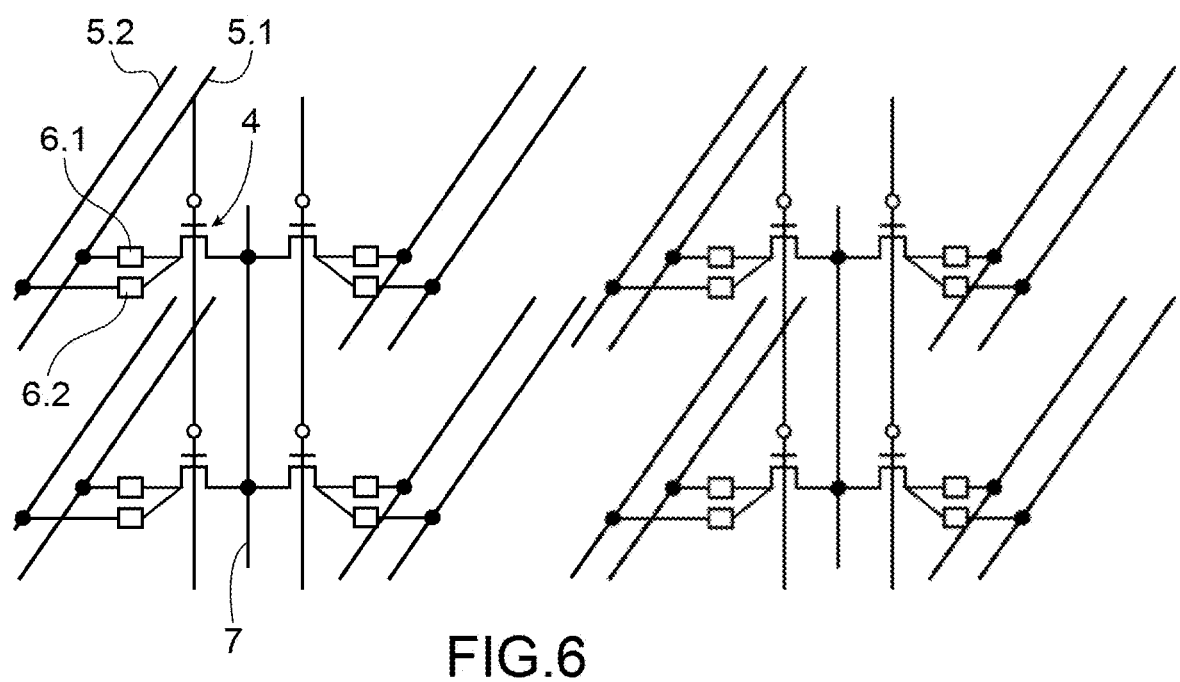
FIG. 6 illustrates an example of a particular arrangement of resistive memory cells in which a same control transistor is associated with two distinct memory elements.

An alternative arrangement is illustrated in FIG. 6. For this alternative, a same control transistor 4 is associated with two resistive elements 6.1, 6.2, respectively connected to a horizontal bias line 5.1 and another distinct horizontal bias line 5.2 and which can thus carry a potential different from that of the bias line 5.1. Resistive elements are connected to a same electrode of the control transistor 4, itself provided with an electrode connected to a vertical bias line 7.

Figure 7:
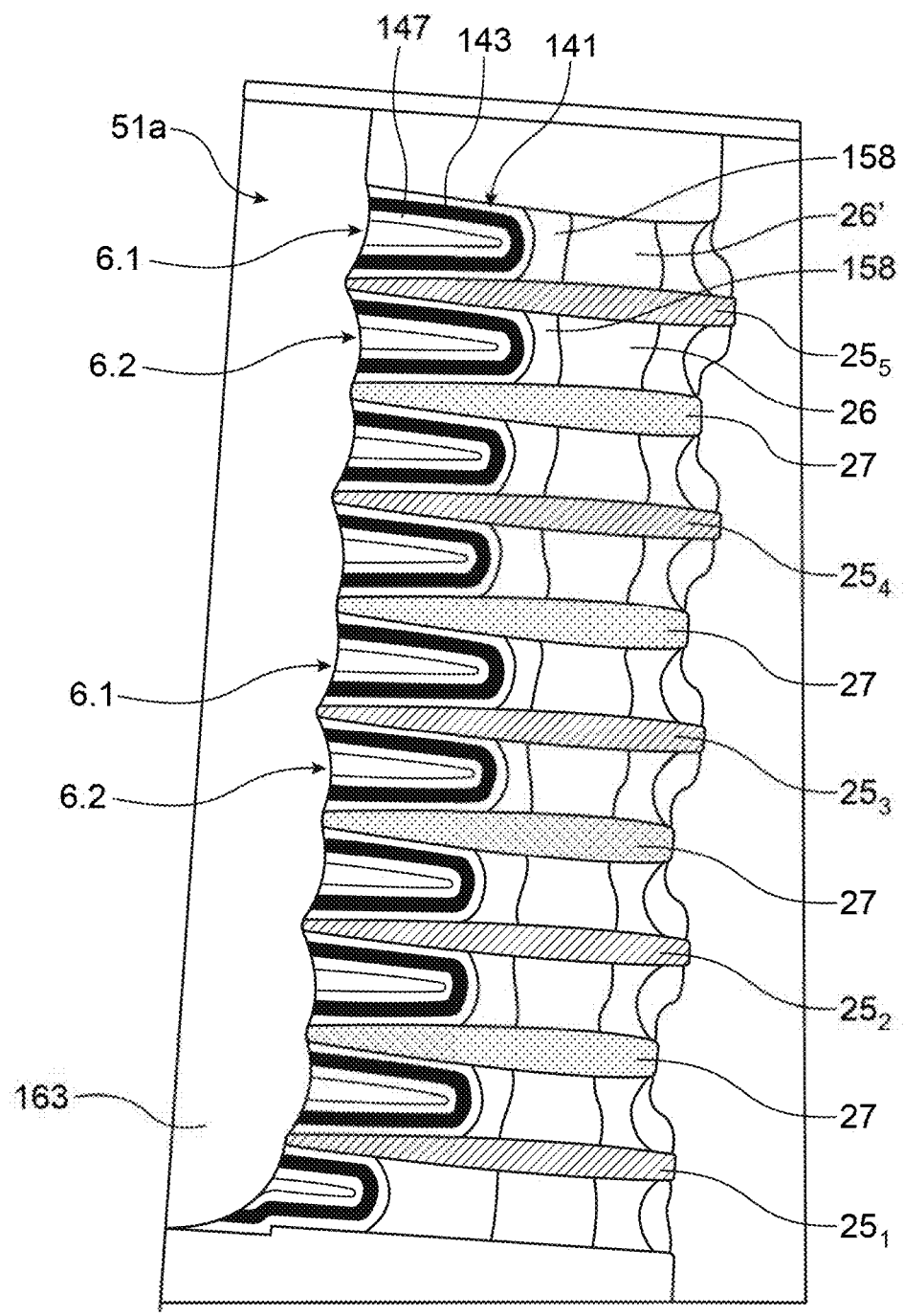
FIG. 7 illustrates an example of an embodiment of a device having an arrangement of the type of FIG. 6.

FIG. 7 illustrates an example of structure repeating such an arrangement type. To implement such a structure, a stack such as previously described for example in connection with FIG. 3B can first be used, stack through which a trench 51a passing through the superimposition of semi-conducting layers $25_3, \ldots, 25_5$, intermediate insulating layers 27 and sacrificial layers 26, 26', is formed.

Subsequently portions of the sacrificial layers 26, 26' located in the trench 51a are removed, through etching, preferably selective etching while keeping the semi-conducting layers $25_1, \ldots, 25_5$ and intermediate insulating layers 27. Thus spaces are freed which are partially filled through an insulating material 158, for example SiCO.

In the remaining spaces, a memory stack is subsequently formed, comprising at least one conducting layer 141 forming a first electrode 41 of memory element, a resistive material layer 143, in particular a dielectric oxide, and another conducting layer 143, forming a second electrode 43 of memory element.

The stack is subsequently removed from the trench 51a, for example through isotropic etching, in order to insulate the respective electrodes of the different memory elements from each other.

And then, the trench is filled with a dielectric material 163 such as for example SiON, in order to make an insulation between the memory elements.

Thus, a structure can be obtained with a control transistor the source or drain region of which is formed in a given semi-conducting layer from the superimposed semi-conducting layers $25_1, \ldots, 25_5$ and is connected both to a memory element 6.1 arranged on an upper face of this given semi-conducting layer and to another memory element 6.2 arranged on a lower face of this given semi-conducting layer, opposite to said upper face.

A particular embodiment provides the integration of resistive memory cells such as previously described into an associative memory or content-addressable memory (CAM) device. This type of memory, rather than enabling a logical datum corresponding to an input address to be output, enables occurrences or presence of data words or logical information to be searched for.

Figure 8:
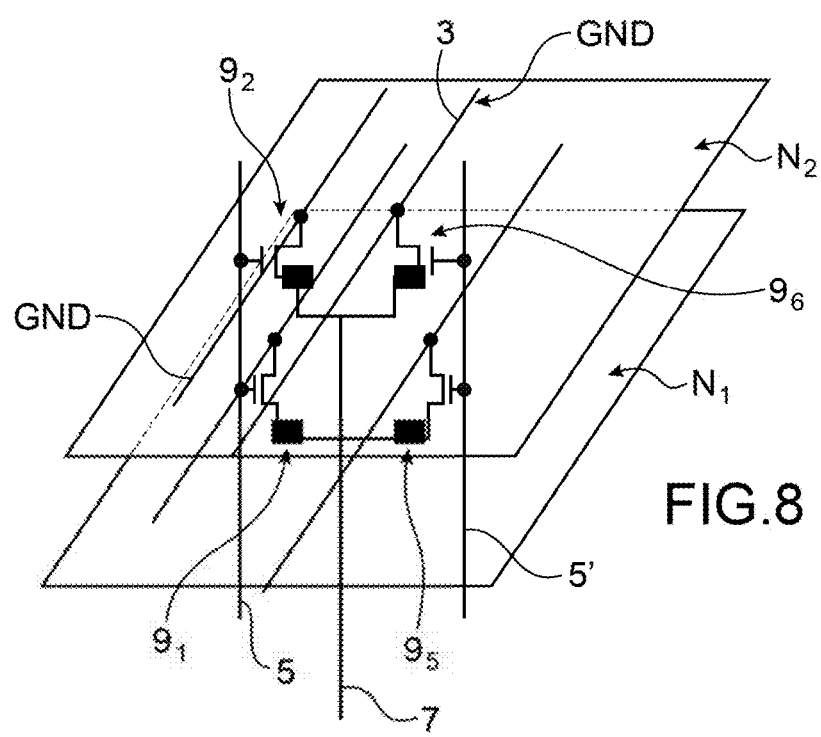
FIG. 8 illustrates an example of a content-addressable memory device provided with resistive cells according to an arrangement such as implemented according to an embodiment of the present invention.

An example of cell arrangement of such a CAM memory is for example given in FIG. 8.

The cells $9_1, 9_2, 9_5, 9_6$ can have an arrangement in which a vertical bias line 7 is common to cells $9_1, 9_2, 9_5, 9_6$ of different levels $N_1, N_2$. The cells $9_1, 9_2, 9_5, 9_6$ are each associated with a horizontal bias line 3 which, in this example, can be connected to the ground GND.

Cells $9_1$ and $9_2$ of different levels $N_1, N_2$ and belonging to a same column of cells have respective control transistors 4 the gates of which are connected to a same conducting zone 5 for receiving a signal representative of a given logical level. Other cells $9_5$ and $9_6$ respectively from the first level $N_1$ and second level $N_2$ belonging to another column and which are connected to the same vertical bias line, have respective control transistors the gates of which are connected to another same conducting zone 5' for receiving a signal representative of a logical level complementary to said given logical level applied to the conducting zone 5.

The invention claimed is:

1. A memory device provided with a support and a plurality of superimposed levels of resistive memory cells formed on the support, each level including one or more rows of one or more resistive memory cell(s), each resistive memory cell comprising a variable resistance memory element, formed of a variable resistivity material zone disposed between a first electrode and a second electrode, the memory element being connected to a source or drain region of a control transistor, the control transistor being formed into a semi-conducting layer of a superimposition of semi-conducting layers formed on the support and in each of which respective channel regions of respective control transistors of resistive memory cells are arranged, the superimposition of semi-conducting layers belonging to a stack comprising one or more insulating layers each disposed between two semi-conducting layers of the superimposition of semi-conducting layers, a first control transistor having a gate which extends against and in contact with an upper face and against and in contact with a lower face of a first semi-conducting layer of the superposition of semi-conducting layers, and a second control transistor having a gate which extends against and in contact with an upper face and against and in contact with a lower face of a second semi-conducting layer of said superimposition of semi-conducting layers, one insulating layer among said one or more insulating layers being disposed between the gate of said first control transistor and the gate of said second control transistor.

2. The memory device according to claim 1, wherein a first vertical column of cells of different levels includes a first cell of a first level and a second cell of a second level from the superimposed levels of cells, the first cell and second cell being respectively provided with the first control transistor and the second control transistor, the first control transistor and second control transistor having a common gate electrode or having respective gate electrodes connected to each other and to a same conducting zone.

3. The memory device according to claim 2, wherein the common gate electrode or the respective gate electrodes is interconnected to a first word plane, a second vertical column of cells including a third cell belonging to the first level and a fourth cell belonging to the second level and respectively provided with a third control transistor and fourth control transistor, the third control transistor and fourth control transistor having a gate connected to the first word plane.

4. The memory device according to claim 3, wherein the first cell and third cell are connected to a same first horizontal bias line from a plurality of horizontal bias lines wherein the second cell and fourth cell are connected to a same second horizontal bias line of the plurality of horizontal bias lines.

5. The memory device according to claim 3, wherein the first cell and third cell are disposed on a same first row of cells of the first level, wherein the second cell and fourth cell are disposed on a same first row of cells of the second level, the device comprising another word plane, distinct from the first word plane, respectively connected to cells of a second row of cells of the first level and to a second row of cells of the second level.

6. The memory device according to claim 5, wherein the first cell and second cell are connected to a same first vertical bias line from a plurality of vertical bias lines, and wherein the third cell and fourth cell are connected to a same second vertical bias line of the plurality of vertical bias lines.

7. The memory device according to claim 6, wherein a fifth cell belonging to the first level and to a second row of cell(s) different from the first row, and a sixth cell belonging to the second level are connected to the first vertical bias line.

8. The memory device according to claim 1, wherein the superimposition of semi-conducting layers belongs to a stack comprising one or more insulating layers each disposed between two semi-conducting layers of the superimposition of semi-conducting layers.

9. The memory device according to claim 1, wherein the source or drain region of the control transistor is connected to another variable resistance memory element formed of the variable resistivity material zone disposed between a third electrode and a fourth electrode, the memory element and the another memory element being respectively arranged on an upper face and on a lower face of the semi-conducting layer.

10. The memory device according to claim 1, wherein the source, channel and drain of the control transistor have a same doping.

11. A content-addressable memory (CAM) comprising a device according to claim 1.

12. A method for making a memory device according to claim 1, the method comprising at least one step of forming a stack of layers on a support, the stack comprising the superimposition of semi-conducting layers.

13. The method according to claim 12, wherein the stack is formed on a semiconductor material surface layer of the support, channel regions of transistors being arranged in the surface layer.

14. The method according to claim 13, wherein each control transistor comprises a source, a channel and a drain having a same doping.

15. The method according to claim 12, wherein the semi-conducting layer is formed through amorphous deposition, the semi-conducting layer being then exposed to a laser annealing so as to make the semi-conducting layer crystalline.

16. The method according to claim 12, wherein, prior to forming the stack, the method comprises forming one or more horizontal routing lines on the support, the routing line(s) being configured to be connected to one or more vertical bias lines.

17. The method according to claim 12, wherein the stack comprises alternating sacrificial layers and semi-conducting layers forming the superimposition of semi-conducting layers, one or more given semi-conducting layers of the superimposition being each arranged on and in contact with a first sacrificial layer and under and in contact with a second sacrificial layer.

18. The method according to claim 17, the method further comprising, after forming the stack, steps of:
forming at least one hole or at least one trench through the stack so as to reveal a zone of the stack,
in the zone, performing a selective etching of parts of sacrificial layers, so as to free a space against a portion of an upper face of the given semi-conducting layer(s) and to free another space against a portion of a lower face of the given semi-conducting layer(s), the lower face being opposite to the upper face, and
forming conducting regions on the portions.

19. The method according to claim 18, comprising after selective etching and prior to forming conducting regions, forming insulating spacers partially filling the spaces.

20. The method according to claim 18, wherein the conducting regions form the first respective electrodes of an assembly of memory elements, the method further comprising steps of:
in the hole or said trench, forming a variable resistivity material layer, and then,
filling the hole or the trench using at least another conducting layer forming the respective second electrodes of the memory elements of the assembly and a vertical bias line connected to the second electrodes of the memory elements of the assembly.

21. The method according to claim 18, wherein the conducting regions are formed of at least one first conducting layer capable of forming a first electrode of memory element, and wherein a variable resistivity material layer is subsequently deposited into the spaces, and then another conducting layer is deposited, forming a second electrode of the memory element, the method further comprising:
removing from the hole or the trench the first conducting layer, the variable resistivity material layer and the other conducting layer and then filling the hole or the trench with an insulating material.

22. The method according to claim 17, further comprising, after forming the stack, steps of:
forming at least one masking covering the stack and including one or more apertures,
performing a selective removal of sacrificial layers so as to continue the aperture(s) of the masking in the stack, and
forming a gate dielectric and a gate conducting electrode in the aperture(s).

23. The memory device according to claim 1, wherein the gate of the first control transistor is formed around a corresponding variable resistivity material zone in a plane of a corresponding level.

24. A memory device provided with a support and several superimposed levels of resistive memory cells formed on the support, each level including one or more rows of one or more resistive memory cell(s), each resistive memory cell comprising a variable resistance memory element formed of a first variable resistivity material zone disposed between a first electrode and a second electrode, the memory element being physically connected to a source or drain region of a control transistor, the control transistor being formed into a given semi-conducting layer of a superimposition of semi-conducting layers formed on the support and in which respective channel regions of respective control transistors of resistive memory cells are arranged,
wherein the given semi-conducting layer of the control transistor is physically connected to another variable resistance memory element formed of a second variable resistivity material zone disposed between a third electrode and a fourth electrode, the memory element and the another memory element being respectively arranged on an upper face and on a lower face of the given semi-conducting layer.

\* \* \* \* \*